United States Patent
Maejima et al.

(10) Patent No.: US 7,916,541 B2
(45) Date of Patent: *Mar. 29, 2011

(54) NAND FLASH MEMORY

(75) Inventors: Hiroshi Maejima, Tokyo (JP); Katsuaki Isobe, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/642,503

(22) Filed: Dec. 18, 2009

(65) Prior Publication Data

US 2010/0097860 A1    Apr. 22, 2010

Related U.S. Application Data

(63) Continuation of application No. 11/873,859, filed on Oct. 17, 2007, now Pat. No. 7,660,157.

(30) Foreign Application Priority Data

Oct. 18, 2006    (JP) .................................. 2006-283457

(51) Int. Cl.
*G11C 16/04* (2006.01)

(52) U.S. Cl. ......... 365/185.11; 365/185.17; 365/185.24; 365/185.26; 365/185.27; 365/185.33

(58) Field of Classification Search ............. 365/185.11, 365/185.17, 185.25, 185.22

See application file for complete search history.

(56) References Cited

U.S. PATENT DOCUMENTS

| | | | |
|---|---|---|---|
| 6,418,058 B1 | 7/2002 | Sakui et al. | |
| 6,512,703 B2 | 1/2003 | Sakui et al. | |
| 6,522,583 B2 | 2/2003 | Kanda et al. | |
| 6,667,904 B2* | 12/2003 | Takeuchi et al. | 365/185.03 |
| 7,301,809 B2* | 11/2007 | Sakui et al. | 365/185.05 |
| 2006/0133150 A1* | 6/2006 | Shibata | 365/185.18 |
| 2007/0255893 A1* | 11/2007 | Takeuchi | 711/103 |
| 2008/0094903 A1 | 4/2008 | Maejima et al. | |

FOREIGN PATENT DOCUMENTS

| | | |
|---|---|---|
| JP | 2001-332093 | 11/2001 |
| JP | 2006-85839 | 3/2006 |
| JP | 2008-47219 | 2/2008 |

* cited by examiner

*Primary Examiner* — Pho M Luu
*Assistant Examiner* — Tha-O Bui
(74) *Attorney, Agent, or Firm* — Oblon, Spivak, McClelland, Maier & Neustadt, L.L.P.

(57) ABSTRACT

A NAND flash memory, in a read operation, a p-type semiconductor substrate is set at a ground potential, a bit line is charged to a first voltage, a source line, a n-type well and a p-type well are charged to a second voltage, which lies between a ground potential and a first voltage, and in a block not selected by said row decoder, said drain-side select gate line and said source-side select gate line are charged to a third voltage, which is higher than said ground potential and is equal to or lower than said second voltage.

16 Claims, 6 Drawing Sheets

NAND FLASH MEMORY

CROSS-REFERENCE TO RELATED APPLICATION

This application is a continuation of U.S. application Ser. No. 11/873,859 filed Oct. 17, 2007, and is based upon and claims the benefit of priority from the prior Japanese Patent Application No. 2006-283457, filed on Oct. 18, 2006, the entire contents of each of which are incorporated herein by reference.

BACKGROUND OF THE INVENTION

1. Field of the Invention

The present invention relates to a NAND flash memory.

2. Background Art

For a non-volatile memory cell, such as a NAND flash memory, data is written by applying a high electrical field to the cell to cause trapping of an electron in an oxide film, thereby changing the threshold of the cell. In addition, data is read by utilizing the variation of the threshold. This holds true for multi-level memory cells (see Japanese Patent Laid-Open Publication No. 2001-332093).

A read operation of the conventional NAND flash memory in the shielded bit line architecture will be briefly described.

The source line and the well of a cell are set at a potential "VSS" (0 V), and a potential "VSG" ("VDD"+"Vth") (about 4V), which allows transfer of "VDD" (2.5 V), is applied to the gate "BLPRE" of the n-type MOS transistor of the sense amplifier. And, a potential of 0.7 V+Vth is applied to the gate "BLCLAMP" of the n-type MOS transistor that connects the sense amplifier and the bit line to each other, thereby pre-charging the bit line of the cell to a voltage of 0.7 V. (→See FIG. 7).

However, not all the bit lines are charged to 0.7 V. The bit lines are alternately charged to 0.7 V and 0 V, and therefore, a half of the bit lines are to be read.

Due to the capacitive coupling, the bit line voltage is affected if the adjacent bit lines voltage is changed during reading. Thus, the bit lines are shielded to prevent data modification caused by data in the adjacent cells.

After the pre-charge, the gate "BLCLAMP" is set at 0 V, and the bit lines are separated from the sense amplifier.

A desired potential "VCGRV" is applied to a word line to be read, a potential "VREAD" (about 5 V) is applied to the other word lines and the drain-side select gate line, and finally the potential "VREAD" is applied to the source-side select gate line.

Thus, if the cell to be read is in the "on" (conductive) state, a cell current flows, and the potential of the bit line approaches 0 V. If the cell to be read is in the "off" (non-conductive) state, no cell current flows, so that the potential of the bit line remains at the pre-charge voltage (0.7 V).

The node "TDC" connected to the latch circuit of the sense amplifier is pre-charged to "VDD", then the gate "BLCLAMP" is raised again and set at "VSEN" (0.35 V+Vth)

Compared with the capacitance of the bit line, the capacitance of the node "TDC" is small. Therefore, when the cell is in the "on" state, if the voltage of the bit line is lower than 0.35 V, charge sharing occurs, and the voltage at the node "TDC" becomes equal to the voltage of the bit line.

When the cell is in the "off" state, if the voltage of the bit line is equal to 0.7 V, the transistor having the gate "BLCLAMP" remains in the off state because the threshold thereof cannot be exceeded, and thus, the voltage at the node "TDC" remains at "VDD". By raising the voltage at the gate of the n-type MOS transistor between the latch circuit and the node "TDC", the voltage at the node "TDC" is transferred to the latch circuit, thereby designating H/L.

The threshold of the cell to be read can be identified by changing the voltage "VCGRV" of the word line of the cell. For example, if the cell has two thresholds, the cell can store two values. If the cell has four thresholds, the cell can store four values.

Thus, if the cell has 16 thresholds, the cell can store 16 values. To store 16 values, the data retention margin of each threshold is reduced. Although the range of thresholds can be expanded to higher thresholds, higher thresholds lead to higher writing voltage and higher reading voltage.

If the writing or reading voltage increases, the writing or reading operation becomes more likely to be disturbed. Therefore, there is a problem that the preset thresholds are also disturbed and shifted. The shift of the thresholds causes erroneous reading.

It can be contemplated that, by setting a negative threshold, the retention margin is improved without increasing the disturbance during reading or writing. Alternatively, this can be achieved by applying a negative potential to the word line.

However, this approach has a disadvantage that the configuration of the well of the Row decoder part has to be modified to transfer the negative potential, so that the number of chip fabrication steps increases.

To overcome the disadvantage, the source line and p-type well of the cell can be biased, thereby making the actual threshold "VGS" of the cell (the voltage of the word line minus the voltage of the source line of the cell) is negative even if a positive voltage is applied to the word line. That is, the threshold distribution can be formed also in the negative region.

However, in this case, the source line and p-type well of whole memory array has to be biased, there can arise a problem that the current consumption increases.

In addition, charging the source line and p-type well of the cell takes additional time, and the reading or writing time increases accordingly (the writing time includes the time required for a verifying operation after writing, as with the reading time).

If the source line and p-type well of the cell array is not biased, only required is the amount of charge enough to charge the selected bit lines.

If the source line and p-type well of the cell is to be biased, an amount of charge is required to bias the source line and p-type well of the cell and non-selected bit lines (shielded bit lines), in addition to the amount of charge required for charging the selected bit lines.

Besides the shielded bit line architecture in which the bit lines are alternately read, there has been proposed a conventional NAND flash memory in which all the bit lines are simultaneously read (see Japanese Patent Laid-Open Publication No. 2006-85839, for example).

Also in the case where all the bit lines are simultaneously read, in order to form a threshold distribution in the negative region, a source line and p-type well of a cell not only in a selected block but also in a non-selected block is biased. In this case, compared with a case where biasing is not carried out, the amount of current required for pre-charging the bit line increases.

Therefore, there can arise a problem that the current consumption increases, as with the shielded bit line architecture.

In addition, as with the shielded bit line architecture, charging the source line and p-type well of the cell takes additional time, and the reading or writing time increases accordingly (the writing time includes the time required for a verifying operation after writing, as with the reading time).

SUMMARY OF THE INVENTION

According one aspect of the present invention, there is provided: a NAND flash memory in which all bit lines are pre-charged and simultaneously read, comprising a memory cell array including a plurality of blocks each of which has a memory cell unit, which includes a plurality of electrically rewritable memory cells connected in series to each other each of which is formed in a p-type well surrounded by a n-type well formed in a p-type semiconductor substrate, a drain-side select gate transistor that is connected to a drain-side select gate line at the gate thereof and connects the memory cell unit to a bit line, and a source-side select gate transistor that is connected to a source-side select gate line at the gate thereof and connects the memory cell unit to a source line;

a row decoder that is connected to word lines connected to gates of said memory cells, said drain-side select gate line and said source-side select gate line, makes a selection from said blocks by controlling the voltage applied to said drain-side select gate line and said source-side select gate line, and selects said memory cell for operation by controlling the voltage applied to said word line; and a sense amplifier that is connected to said bit lines of said memory cell array and detects data in said selected memory cell, wherein in a read operation, said p-type semiconductor substrate is set at a ground potential, said bit line is charged to a first voltage, said source line, said n-type well and said p-type well are charged to a second voltage, which lies between said ground potential and said first voltage, and in said block not selected by said row decoder, said drain-side select gate line and said source-side select gate line are charged to a third voltage, which is higher than said ground potential and is equal to or lower than said second voltage.

According another aspect of the present invention, there is provided: a NAND flash memory in which all bit lines are pre-charged and simultaneously read, comprising a memory cell array including a plurality of blocks each of which has a memory cell unit, which includes a plurality of electrically rewritable memory cells connected in series to each other each of which is formed in a p-type well surrounded by a n-type well formed in a p-type semiconductor substrate, a drain-side select gate transistor that is connected to a drain-side select gate line at the gate thereof and connects the memory cell unit to a bit line, and a source-side select gate transistor that is connected to a source-side select gate line at the gate thereof and connects the memory cell unit to a source line;

a row decoder that is connected to word lines connected to gates of said memory cells, said drain-side select gate line and said source-side select gate line, makes a selection from said blocks by controlling the voltage applied to said drain-side select gate line and said source-side select gate line, and selects said memory cell for operation by controlling the voltage applied to said word line; and a sense amplifier that is connected to said bit lines of said memory cell array and detects data in said selected memory cell, wherein in a verifying operation, said p-type semiconductor substrate is set at a ground potential, said bit line is charged to a first voltage, said source line, said n-type well and said p-type well are charged to a second voltage, which lies between said ground potential and said first voltage, and in said block not selected by said row decoder, said drain-side select gate line and said source-side select gate line are charged to a third voltage, which is higher than said ground potential and is equal to or lower than said second voltage.

BRIEF DESCRIPTION OF THE DRAWINGS

FIG. 3A is a diagram showing a configuration of essential parts including the voltage generating circuit that applies the voltage "Vs" to the source line of a cell or the like;

FIG. 3B is a diagram showing a configuration of essential parts including a voltage generating circuit that applies two voltages "Vs" and "Vs2" to the source line of a cell or the like;

DETAILED DESCRIPTION

In the following, there will be described a NAND flash memory all of bit lines of which are precharged and simultaneously read.

An embodiment of the present invention will be described below with reference to the drawings.

Embodiment

Figure 1:
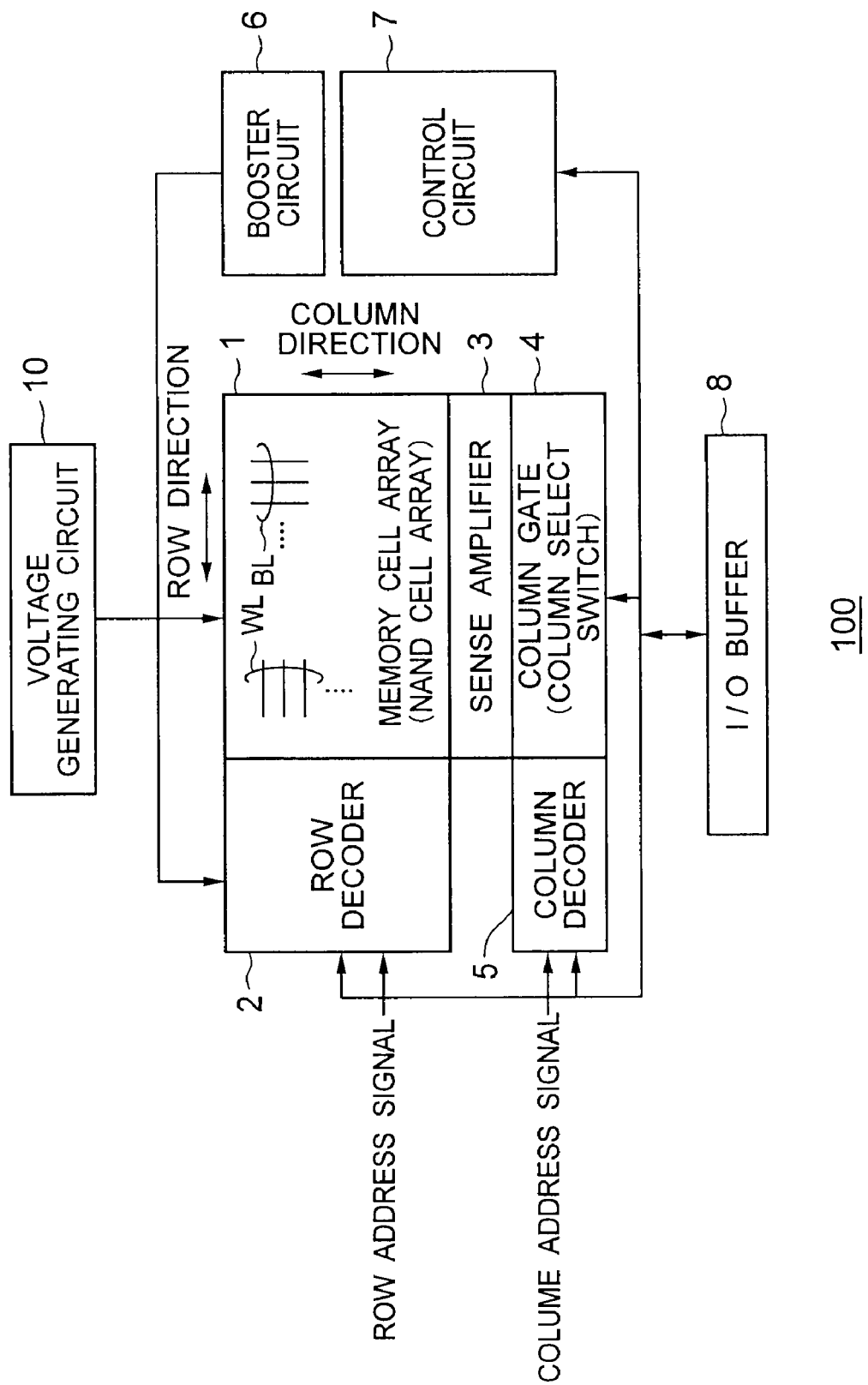
FIG. 1 is a block diagram showing a configuration of essential parts of a NAND flash memory 100 according to an embodiment of the present invention, which is an aspect of the present invention.
Figure 2:
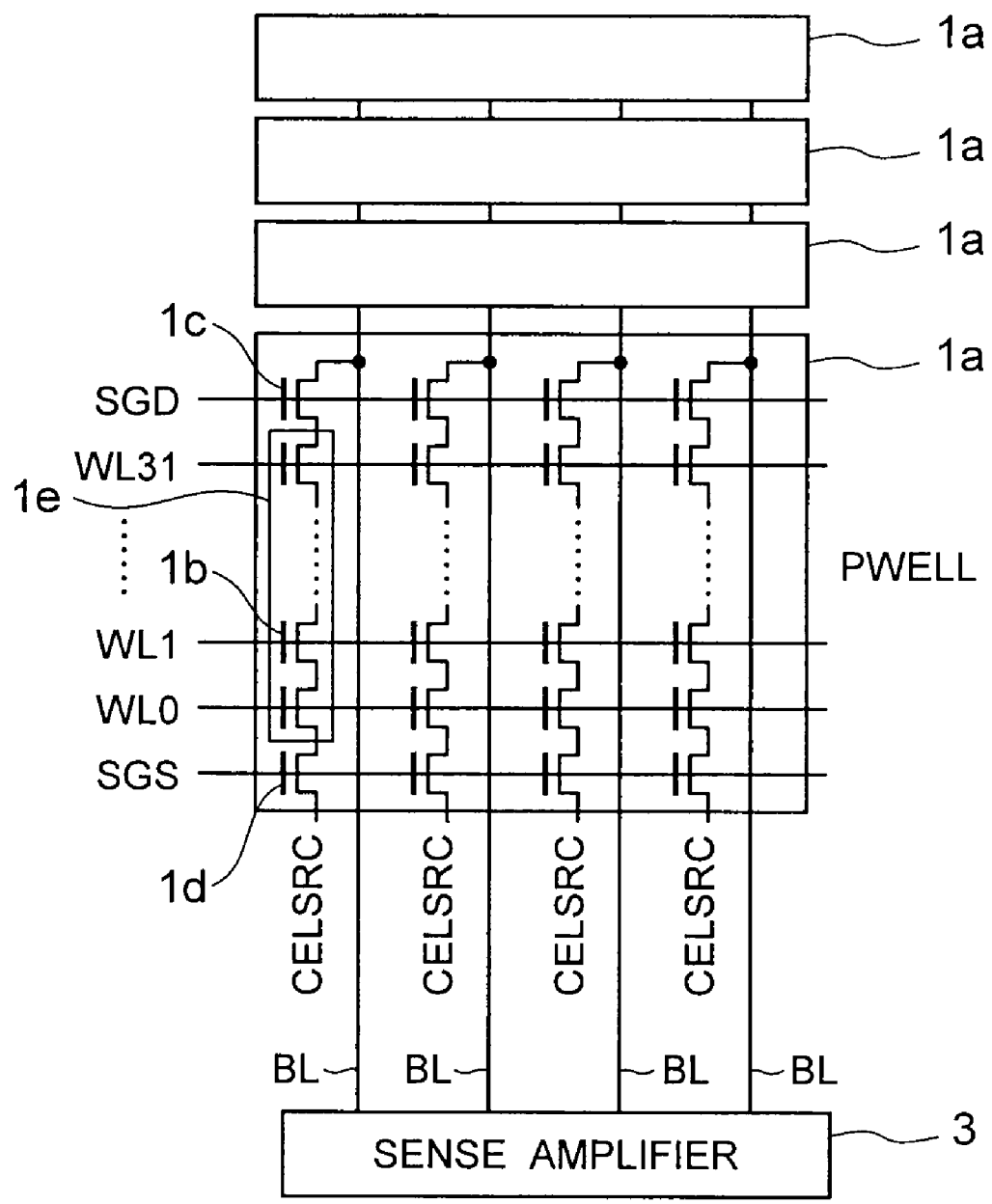
FIG. 2 is a circuit diagram showing a configuration of essential parts of a memory cell array of the NAND flash memory 1 shown in FIG. 1.

FIG. 1 is a block diagram showing a configuration of essential parts of a NAND flash memory 100 according to an embodiment of the present invention, which is an aspect of the present invention. FIG. 2 is a circuit diagram showing a configuration of essential parts of a memory cell array of the NAND flash memory 1 shown in FIG. 1.

As shown in FIGS. 1 and 2, the memory cell array 1 has a plurality of cell units arranged in an array.

On the memory cell array 1, word lines (control gate lines) "WL0" to "WL31" extending in a row direction and bit lines "BL" extending in a column direction are disposed. The word lines "WL0" to "WL31" are connected to a row decoder 2, and the bit lines "BL" are connected to a sense amplifier 3, which has a latch circuit for temporarily storing write data and read data.

The memory cell array 1 includes a plurality of blocks 1a connected to the common bit lines "BL". Each block 1a has a plurality of memory cell units 1e each of which is composed of a plurality of memory cells 1b connected to each other, drain-side select gate transistors 1c that connect the associated memory cell units 1e to the respective bit lines "BL" and are connected to a drain-side select gate line "SGD" at the gates thereof, and source-side select gate transistors 1d that connect the associated memory cell units to respective source lines "CELSRC" and are connected to a source-side select gate line "SGS" at the gates thereof.

As described above, each cell unit 1e is composed of a plurality of electrically rewritable memory cells 1b connected to each other. The memory cell 1b is formed in a p-type well "PWELL" surrounded by a n-type well "NWELL". The n-type well "NWELL" formed in a p-type semiconductor substrate "Psub".

The sense amplifier 3 is connected to an I/O buffer 8 via a column gate (column select switch) 4. The column gate 4 is controlled by an output signal from a column decoder 5. That is, the sense amplifier 3 is controlled by the column decoder 5.

The sense amplifier 3 pre-charges the bit lines of the memory cell array 1 and detects data stored in the memory cells 1b by detecting the voltage on the bit lines "BL", which varies with the on/off operation of the memory cells 1b.

As shown in FIG. 1, a booster circuit 6 generates voltages required in a write mode, an erase mode and a read mode. For example, when writing data, the booster circuit 6 generates a write voltage and supplies the write voltage to the row decoder 2.

The row decoder 2 is connected to the word lines "WL" and the select gate lines of the memory cell array 1 and applies a signal voltage to make a selection therefrom. A row address signal is input to the row decoder 2, and a column address signal is input to the column decoder 5.

The control circuit 7 controls the operation of the row decoder 2, the column gate 4 and the column decoder 5 depending on the operation mode. For example, when writing data, the control circuit 7 controls the timing of switching of the potential applied to the word lines "WL", the drain-side select gate line "SGD" and the source-side select gate line "SGS".

The NAND flash memory 100 further has a voltage generating circuit 10 that applies a voltage "Vs" to the source line "CELSRC" of a cell or the like.

Figure 3A:
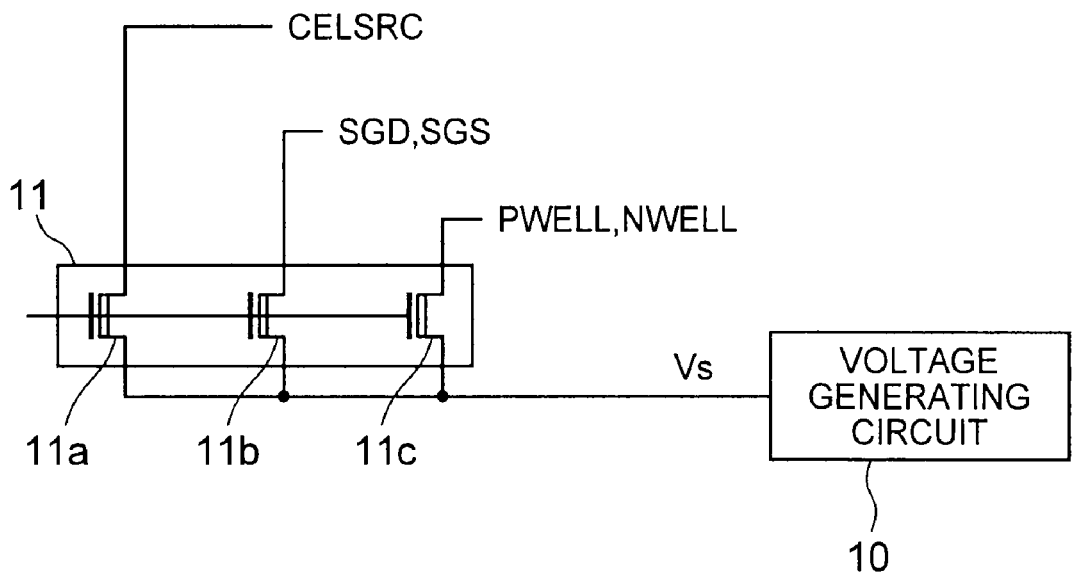

FIG. 3A is a diagram showing a configuration of essential parts including the voltage generating circuit that applies the voltage "Vs" to the source line "CELSRC" of a cell or the like.

As shown in FIG. 3A, the voltage generating circuit 10 is connected to the source line "CELSRC", the source-side select gate line "SGS" of non-selected blocks, the drain-side select gate line "SGD" of non-selected blocks, the p-type well "PWELL" and the n-type well "NWELL" of a cell via a switch circuit 11 having transistors 11a, 11b and 11c.

The voltage generating circuit 10 applies a second voltage "Vs" to the source line "CELSRC", the source-side select gate line "SGS" of non-selected blocks and the drain-side select gate line "SGD" of non-selected blocks, and the p-type well "PWELL" and the n-type well "NWELL" of a cell by turning on the transistors 11a, 11b and 11c, respectively.

In addition, after the second voltage "Vs" is applied, the source line "CELSRC", the source-side select gate line "SGS" of non-selected blocks and the drain-side select gate line "SGD" of non-selected blocks, and the p-type well "PWELL" and the n-type well "NWELL" of the cell can be brought into a floating state by turning off the transistors 11a, 11b and 11c, respectively.

Figure 3B:
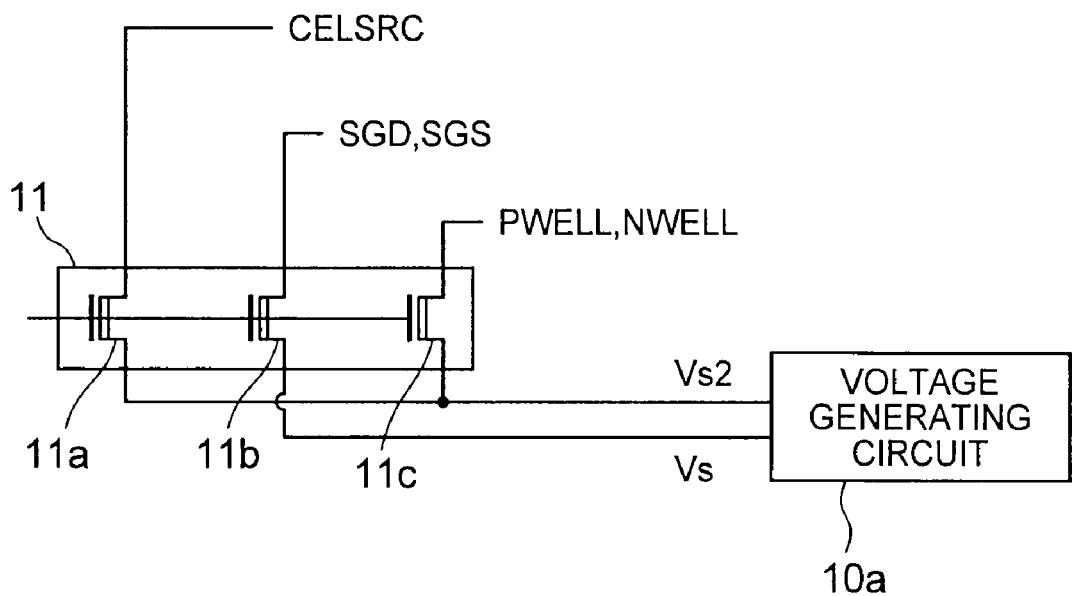

FIG. 3B is a diagram showing a configuration of essential parts including a voltage generating circuit that applies two voltages "Vs" and "Vs2" to the source line of a cell or the like. In FIG. 3B, the same reference numerals as those in FIG. 3A denote the same parts as those in FIG. 3A.

As shown in FIG. 3B, a voltage generating circuit 10a can apply a third voltage "Vs2", which lies between the voltage "Vs" applied to the source line "CELSRC", the p-type well "PWELL" and the n-type well "NWELL" of the cell and a ground potential "VSS", to the source-side select gate line "SGS" of non-selected blocks and the drain-side select gate "SGD" of non-selected blocks via the transistor 11b.

In the read operation (or in a verifying operation), the NAND flash memory 100 sets the p-type semiconductor substrate "Psub" at the ground potential "VSS". In this state, the sense amplifier 3 charges the bit lines "BL" to a first voltage "Vb" (that is, performs the pre-charge required for reading of the memory cells described above). Besides the charging, the voltage generating circuit 10 charges the source lines "CELSRC", the p-type wells "PWELL" and the n-type wells "NWELL" of the memory array to the second voltage "Vs" lying between the ground potential "VSS" and the first voltage "Vb". Furthermore, the voltage generating circuits 10, 10a charge the drain-side select gate line "SGD" of the non-selected blocks and the source-side select gate line "SGS" of the non-selected blocks to the second voltage "Vs" (or the third voltage "Vs2").

Now, a read operation of the NAND flash memory 100 configured as described above will be briefly described. The description holds true for the verifying operation.

In the read operation, first, the sense amplifier 3 charges all the bit lines "BL" (to the first voltage "Vb"). The sense amplifier 3 supplies an amount of current required for the cells to keep the voltage. The sense amplifier performs the read operation by comparing the amount of current with a reference current amount to determine whether the cells are in a "High" state or a "Low" state, and determining bit information based on the result of the determination.

The read procedure proceeds as follows. First, a read voltage is applied to the gates of the memory cells 1b via word lines "WL0" to "WL31" to determine whether the memory cells 1b are turned on or remain in the off state.

If a memory cell 1b is turned on, it means that the amount of the supplied current is greater than the reference current amount. The sense amplifier 3 senses the result and stores the information that the memory cell 1b is in the "Low" state.

If a memory cell 1b is turned off, it means that the amount of the supplied current is smaller than the reference current amount. The sense amplifier 3 senses the result and stores the information that the memory cell 1b is in the "High" state.

Based on the stored information on whether the memory cells 1b are in the "High" state or the "Low" state, the sense amplifier 3 creates data to determine bit information.

Then, the sense amplifier 3 outputs the determined bit information via an I/O buffer 8.

As described above, in the NAND flash memory 100, the blocks 1a selected by the row decoder 2 and the blocks 1a not selected by the row decoder 2 are connected to the common bit lines "BL". When simultaneously reading all the bit lines "BL", a voltage is applied to the source lines "CELSRC", the p-type wells "PWELL" and the n-type wells "NWELL" of the cells in order to form a threshold distribution also in the negative region. Therefore, in the read operation described above, the bit lines "BL" disposed on the blocks 1a not selected are also charged although data is not read from the blocks 1a not selected.

Now, the amount of charge required to charge the bit lines disposed on the blocks 1a not selected in the read operation will be discussed. In the example described below, it is supposed that the second voltage "Vs" and the third voltage "Vs2" are equal.

Figure 4A:
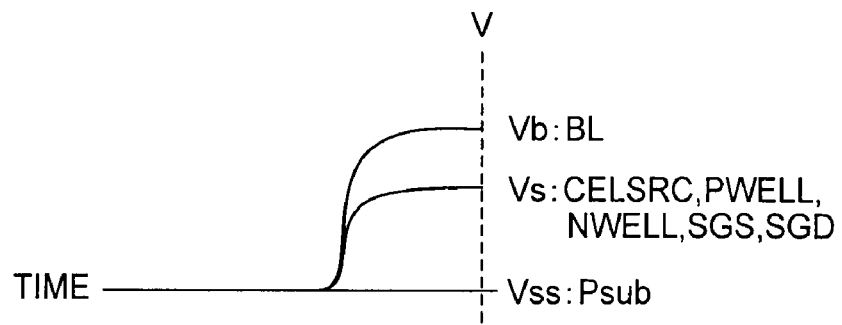
FIG. 4A is a graph showing a relationship between time and voltage applied to a bit line or the like of a non-selected block of the NAND flash memory 100 in the read operation according to the embodiment.
Figure 4B:
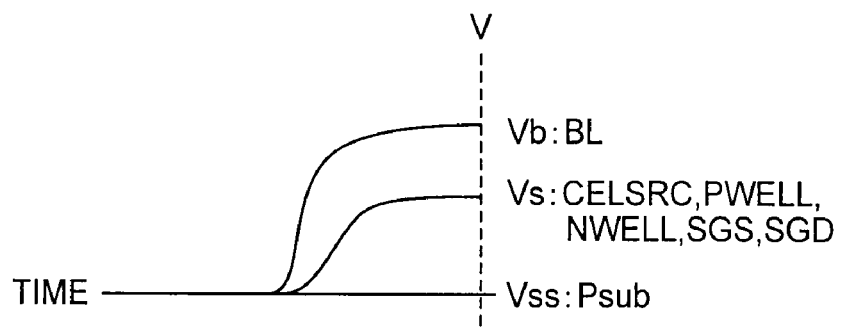
FIG. 4B is a graph showing another relationship between voltage and time applied to a bit line or the like of a non-selected block of the NAND flash memory 100 in the read operation according to the embodiment.
Figure 4C:
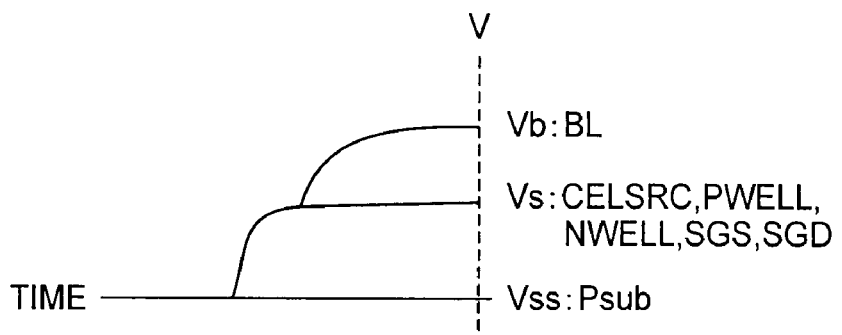
FIG. 4C is a graph showing another relationship between voltage and time applied to a bit line or the like of a non-selected block of the NAND flash memory 100 in the read operation according to the embodiment.

FIG. 4A is a graph showing a relationship between time and voltage applied to a bit line or the like of a non-selected block of the NAND flash memory 100 in the read operation according to the embodiment. FIG. 4B is a graph showing another relationship between voltage and time applied to a bit line or the like of a non-selected block of the NAND flash memory 100 in the read operation according to the embodiment. FIG. 4C is a graph showing another relationship between voltage and time applied to a bit line or the like of a non-selected block of the NAND flash memory 100 in the read operation according to the embodiment.

Figure 5:
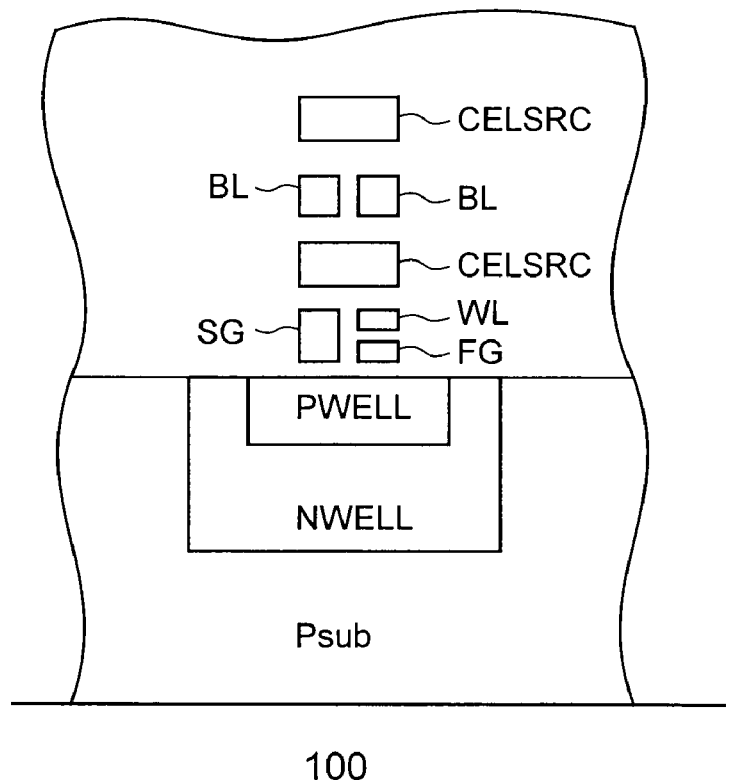
FIG. 5 is a diagram showing a cross-sectional structure of the NAND flash memory 100.
Figure 6:
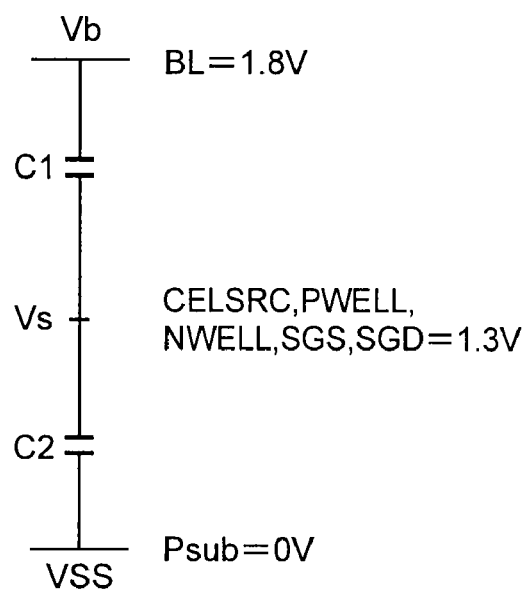
FIG. 6 is an equivalent circuit diagram showing voltages at parts of the NAND flash memory 100 shown in FIG. 5 and capacitances between the parts.
Figure 7:
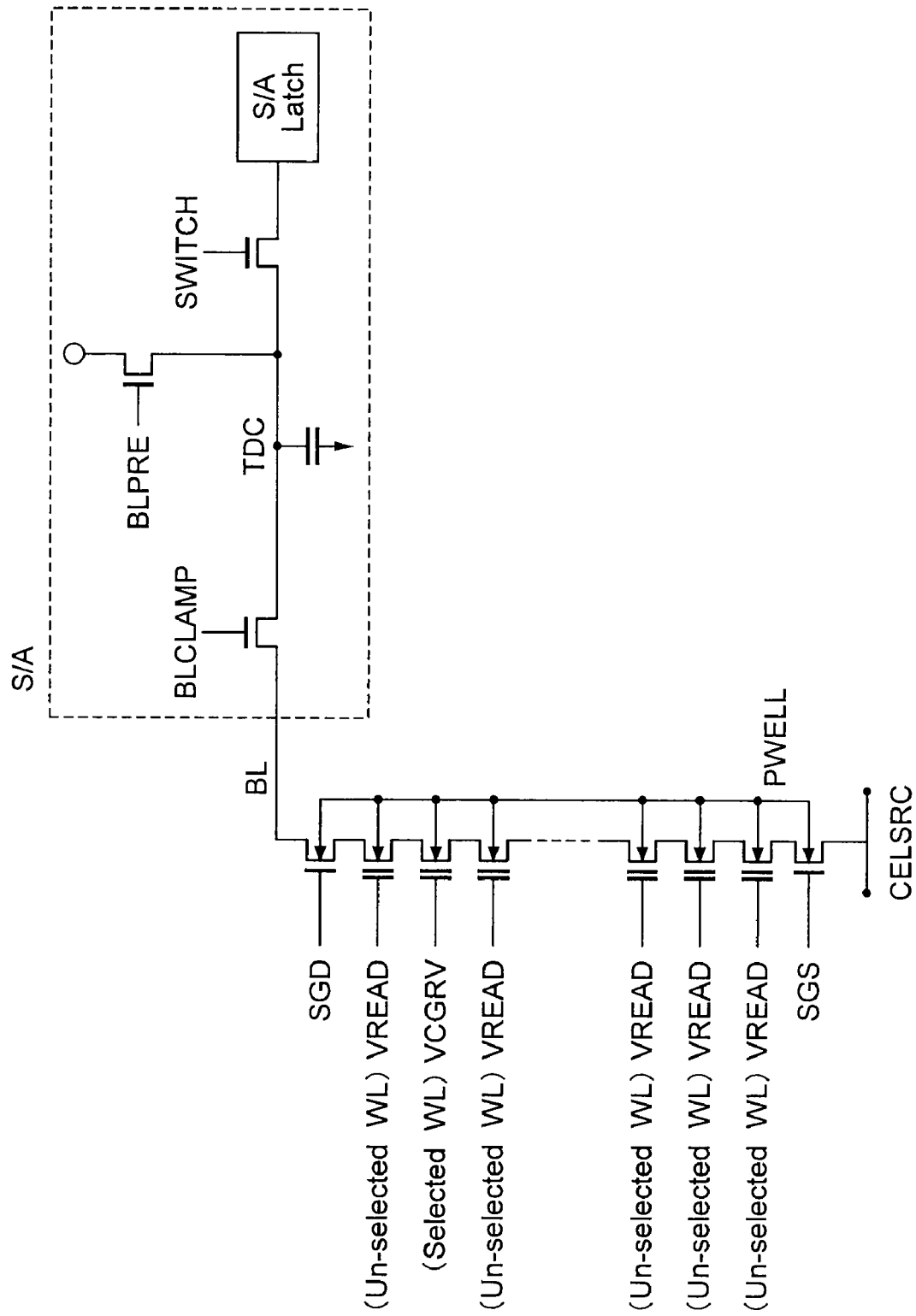
FIG. 7 is a schematic showing a sense amp of the shielded bit line architecture.

FIG. 5 is a diagram showing a cross-sectional structure of the NAND flash memory 100. FIG. 6 is an equivalent circuit diagram showing voltages at parts of the NAND flash memory 100 shown in FIG. 5 and capacitances between the parts.

For example, when charging the bit lines "BL" in the read operation (or in the verifying operation), as shown in FIG. 4A, the drain-side select gate line "SGD" of non-selected blocks, the source-side select gate line "SGS" of non-selected blocks, the source lines "CELSRC", the n-type wells "NWELL" and the p-type wells "PWELL" are brought into the floating state. In this state, the bit lines "BL" are charged to the first voltage "Vb", thereby charging the drain-side select gate line "SGD", the source-side select gate line "SGS", the source lines "CELSRC", the n-type wells "NWELL" and the p-type wells "PWELL" to the second voltage "Vs".

The parts of the NAND flash memory 100 whose bit lines "BL" are charged are arranged as shown in FIG. 5. In order to schematically describe the amount of charged required to charge a bit line "BL", the combined capacitance between the bit line "BL" and the drain-side select gate line "SGD", the source-side select gate line "SGS", the source line "CELSRC", the n-type well "NWELL" and the p-type well "PWELL" is represented by "C1", as shown in FIG. 6. In addition, the combined capacitance between the drain-side select gate line "SGD", the source-side select gate line "SGS", the source line "CELSRC", the n-type well "NWELL" and the p-type well "PWELL" and the p-type semiconductor substrate "Psub" is represented by "C2".

In FIG. 6, a control gate is included in a select gate line "SG". Furthermore, in FIG. 6, illustration of a word line "WL" and a floating gate FG of a non-selected block in the floating state is omitted, because the effect thereof on the change in potential is small.

As described above, when the drain-side select gate line "SGD", the source-side select gate line "SGS", the p-type well "PWELL" and the n-type well "NWELL" are in the floating state, if the bit line "BL" is charged to the first voltage "Vb" (1.8 V, for example), the voltage at the drain-side select gate line "SGD", the source-side select gate line "SGS", the p-type well "PWELL" and the n-type well "NWELL" automatically converges to the second voltage "Vs" (1.3 V, for example), which is determined by the ratio between the combined capacitance "C1" and the combined capacitance "C2".

Therefore, the total amount of charge "Q" required to charge the drain-side select gate line "SGD", the source-side select gate line "SGS", the p-type well "PWELL" and the n-type well "NWELL" to $$Vs = Vb\left(\frac{C1}{C1+C2}\right),$$

or in other words, to charge the bit line "BL" to "Vb", is expressed as follows (FIG. 6).

$$Q = Vb\left(\frac{C1 C2}{C1+C2}\right)$$

In the case where the bit lines "BL" is charged in the read operation (or in the verifying operation) as shown in FIG. 4A, the required amount of charge is substantially equal to that in a conventional technique that charges only the bit lines "BL" and does not charge the source lines "CELSRC", the p-type wells "PWELL", the n-type wells "NWELL", the source-side select gate line "SGS" and the drain-side select gate line "SGD" of the cells.

In addition, there has been investigated under the same conditions a conventional technique that sets the p-type semiconductor substrate "Psub" at the ground potential "VSS", sets the source-side select gate line "SGS" and the drain-side select gate line "SGD" at the ground potential "VSS" to cut off the non-selected block, and charges the bit lines to "Vb" after charging the source lines "CELSRC", the p-type wells "PWELL" and the n-type wells "NWELL" of the cells to form a threshold distribution in the negative region. This investigation has showed that, in the case where the bit lines "BL" is charged in the read operation as shown in FIG. 4A, the required amount of charge is about a quarter of that of the conventional technique.

This is because the potential at the source-side select gate line "SGS" of the non-selected block and the drain-side select gate line "SGD" of the non-selected block is higher than the ground potential "VSS", so that the total amount of charge mainly required to charge the capacitance between the drain-side select gate line "SGD" and the source-side select gate line "SGS" the bit lines "BL" and the wells is reduced compared with the conventional technique in which the source-side select gate line "SGS" and the drain-side select gate line "SGD" are set at the ground potential "VSS".

In this way, the NAND flash memory 100 can form a threshold distribution not only in the positive region but also in the negative region while suppressing an increase of the amount of charge required to charge the bit lines "BL" or an increase of the charge time.

As described above, in the case where the bit lines "BL" are charged as shown in FIG. 4A, the amount of charge "Q" required to charge a selected bit line "BL" to "Vb" depends on the ratio between the capacitances "C1" and "C2". If the capacitance ratio varies, the target potential for the second potential "Vs" shifts. Thus, the voltage generating circuit 10, which supplies the second potential "Vs", has to supply an amount of charge to compensate for the shift.

Thus, in the case where the bit lines "BL" are charged in the read operation (or in the verifying operation) as shown in FIG.

4B, the p-type semiconductor substrate "Psub" is set at the ground potential "VSS". Furthermore, in the block not selected by the row decoder 2, the source-side select gate line "SGS", the drain-side select gate line "SGD", the source lines "CELSRC", the n-type wells "NWELL" and the p-type wells "PWELL" are charged to the second voltage "Vs" by the voltage generating circuit 10. Simultaneously with the charge, the bit lines "BL" are charged to the first voltage "Vb".

Since the second voltage "Vs" is controlled by the voltage generating circuit 10 in this way, the shift of the second voltage "Vs" from the target voltage can be reduced.

In the case where the bit lines "BL" are charged in the read operation as shown in FIG. 4B, as in the case shown in FIG. 4A, the amount of charge required to charge the bit lines "BL" to the first voltage "Vb" can be reduced.

Alternatively, as shown in FIG. 4C, in the case where the bit lines "BL" are charged in the read operation (or in the verifying operation), the bit lines "BL", the drain-side select gate line "SGD", the source-side select gate line "SGS", the source lines "CELSRC", the n-type wells "NWELL" and the p-type wells "PWELL" are charged to the second voltage "Vs". After that, with the drain-side select gate line "SGD", the source-side select gate line "SGS", the source lines "CELSRC", the n-type wells "NWELL" and the p-type wells "PWELL" maintained at the second voltage "vs" under the control of the voltage generating circuit 10, the bit lines "BL" are charged to the first voltage "Vb".

Since the second voltage "vs" is controlled by the voltage generating circuit 10 in this way, the shift of the second voltage "Vs" from the target voltage can be reduced.

In the case where the bit lines "BL" are charged in the read operation as shown in FIG. 4C, as in the cases shown in FIGS. 4A and 4B, the amount of charge required to charge the bit lines "BL" to the first voltage "Vb" can be reduced.

As described above with reference to FIGS. 4A to 4C, if the drain-side select gate line "SGD" and the source-side select gate line "SGS" of the non-selected block 1a are charged, the amount of charge required to charge the bit lines "BL" decreases. However, if the drain-side select gate transistor 1c and the source-side select gate transistor 1d are turned on, a current flows through the memory cells 1b.

Thus, in order to cut off at least the source-side select gate transistor 1d of the non-selected block 1a, the drain-side select gate line "SGD" and the source-side select gate line "SGS" have to be charged to the third voltage "Vs2" that is higher than the ground potential "VSS" and is equal to or lower than the second voltage "Vs" on the source lines "CELSRC" of the memory cells. The third voltage "Vs2" can be applied to the drain-side select gate line "SGD" and the source-side select gate line "SGS" by the voltage generating circuit 10a described above.

As described above, the amount of charge required to charge the bit lines to the first voltage "Vb" can be reduced by setting the third voltage higher than the ground potential "VSS" and equal to or lower than the second voltage "Vs" on the source lines "CELSRC" of the memory cells.

As described above, the NAND flash memory according to this embodiment can form a distribution of thresholds of cells in the negative region while preventing an increase in current consumption or pre-charge time.

What is claimed is:

1. A NAND flash memory in which all bit lines are pre-charged and simultaneously read, comprising:
   a memory cell array including a plurality of blocks each of which includes:
      a memory cell unit, which includes a plurality of electrically rewritable memory cells connected in series to each other and each of which is formed in a p-type well surrounded by a n-type well formed in a p-type semiconductor substrate,
      a drain-side select gate transistor that is connected to a drain-side select gate line at the gate thereof and that connects the memory cell unit to a bit line, and
      a source-side select gate transistor that is connected to a source-side select gate line at the gate thereof and that connects the memory cell unit to a source line;
   a row decoder that is connected to word lines connected to gates of the memory cells, the drain-side select gate line and the source-side select gate line, that makes a selection from the blocks by controlling the voltage applied to the drain-side select gate line and the source-side select gate line, and that selects the memory cell for operation by controlling the voltage applied to the word line; and
   a sense amplifier that is connected to the bit lines of the memory cell array and that detects data in the selected memory cell,
   wherein in a read operation,
      the p-type semiconductor substrate is set at a ground potential,
      the bit line is charged to a first voltage,
      the source line, the n-type well and the p-type well are charged to a second voltage, which lies between the ground potential and the first voltage, and
      in the block not selected by the row decoder, the source-side select gate transistor is cut off.

2. The NAND flash memory according to claim 1, wherein in the block not selected by the row decoder, the drain-side select gate line and the source-side select gate line are charged to a third voltage, which is higher than the ground potential and is equal to or lower than the second voltage, to cut off at least the source-side select gate transistor.

3. The NAND flash memory according to claim 2, wherein the second voltage and the third voltage are equal.

4. The NAND flash memory according to claim 3, wherein the drain-side select gate line, the source-side select gate line, the source line, the n-type well and the p-type well are brought into a floating state, and the bit lines are charged to the first voltage, thereby charging the drain-side select gate line, the source-side select gate line, the source line, the n-type well and the p-type well to the second voltage.

5. The NAND flash memory according to claim 3, wherein the drain-side select gate line, the source-side select gate line, the source line, the n-type well and the p-type well are charged to the second voltage simultaneously with the bit lines being charged to the first voltage.

6. The NAND flash memory according to claim 3, wherein the bit lines, the drain-side select gate line, the source-side select gate line, the source line, the n-type well and the p-type well are charged to the second voltage, and
   after that, the bit lines are charged to the first voltage with the drain-side select gate line, the source-side select gate line, the source line, the n-type well and the p-type well maintained at the second voltage.

7. The NAND flash memory according to claim 2, further comprising:
   a voltage generating circuit that charges the source line, the n-type well and the p-type well to the second voltage and that charges the drain-side select gate line and the source-side select gate line to the third voltage.

8. The NAND flash memory according to claim 3, further comprising:

a voltage generating circuit that charges the source line, the n-type well, the p-type well, the drain-side select gate line and the source-side select gate line to the second voltage.

9. A NAND flash memory in which all bit lines are precharged and simultaneously read, comprising:
- a memory cell array including a plurality of blocks each of which includes:
  - a memory cell unit, which includes a plurality of electrically rewritable memory cells connected in series to each other and each of which is formed in a p-type well surrounded by a n-type well formed in a p-type semiconductor substrate,
  - a drain-side select gate transistor that is connected to a drain-side select gate line at the gate thereof and that connects the memory cell unit to a bit line, and
  - a source-side select gate transistor that is connected to a source-side select gate line at the gate thereof and that connects the memory cell unit to a source line;
- a row decoder that is connected to word lines connected to gates of the memory cells, the drain-side select gate line and the source-side select gate line, that makes a selection from the blocks by controlling the voltage applied to the drain-side select gate line and the source-side select gate line, and that selects the memory cell for operation by controlling the voltage applied to the word line; and
- a sense amplifier that is connected to the bit lines of the memory cell array and that detects data in the selected memory cell,
- wherein in a verifying operation,
  - the p-type semiconductor substrate is set at a ground potential,
  - the bit line is charged to a first voltage,
  - the source line, the n-type well and the p-type well are charged to a second voltage, which lies between the ground potential and the first voltage, and
  - in the block not selected by the row decoder, the source-side select gate transistor is cut off.

10. The NAND flash memory according to claim 9, wherein in the block not selected by the row decoder, the drain-side select gate line and the source-side select gate line are charged to a third voltage, which is higher than the ground potential and is equal to or lower than the second voltage, to cut off at least the source-side select gate transistor.

11. The NAND flash memory according to claim 10, wherein the second voltage and the third voltage are equal.

12. The NAND flash memory according to claim 11, wherein the drain-side select gate line, the source-side select gate line, the source line, the n-type well and the p-type well are brought into a floating state, and the bit lines are charged to the first voltage, thereby charging the drain-side select gate line, the source-side select gate line, the source line, the n-type well and the p-type well to the second voltage.

13. The NAND flash memory according to claim 11, wherein the drain-side select gate line, the source-side select gate line, the source line, the n-type well and the p-type well are charged to the second voltage simultaneously with the bit lines being charged to the first voltage.

14. The NAND flash memory according to claim 11, wherein the bit lines, the drain-side select gate line, the source-side select gate line, the source line, the n-type well and the p-type well are charged to the second voltage, and
- after that, the bit lines are charged to the first voltage with the drain-side select gate line, the source-side select gate line, the source line, the n-type well and the p-type well maintained at the second voltage.

15. The NAND flash memory according to claim 10, further comprising:
- a voltage generating circuit that charges the source line, the n-type well and the p-type well to the second voltage and that charges the drain-side select gate line and the source-side select gate line to the third voltage.

16. The NAND flash memory according to claim 11, further comprising:
- a voltage generating circuit that charges the source line, the n-type well, the p-type well, the drain-side select gate line and the source-side select gate line to the second voltage.

* * * * *